United States Patent
Huang et al.

(10) Patent No.: US 6,245,492 B1
(45) Date of Patent: *Jun. 12, 2001

(54) PHOTORESIST SYSTEM AND PROCESS FOR AERIAL IMAGE ENHANCEMENT

(75) Inventors: Wu-Song Huang; Ahmad D. Katnani, both of Poughkeepsie; Ranee W. Kwong, Wappingers Falls; Kathleen H. Martinek, Newburgh, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/133,204

(22) Filed: Aug. 13, 1998

(51) Int. Cl.[7] ........................................ G03C 5/00
(52) U.S. Cl. ........................ 430/326; 430/330; 430/394
(58) Field of Search ..................... 430/325, 326, 430/228, 330, 964, 394, 333

(56) References Cited

U.S. PATENT DOCUMENTS

| | | | |
|---|---|---|---|
| 4,142,107 | 2/1979 | Hatzakis et al. | 250/571 |
| 4,548,896 | * 10/1985 | Sabongi et al. | 430/332 |
| 4,745,042 | * 5/1988 | Sasago et al. | 430/311 |
| 4,816,115 | 3/1989 | Horner et al. | 156/643 |
| 4,927,732 | 5/1990 | Merrem et al. | 430/191 |
| 5,229,258 | 7/1993 | Sezi et al. | 430/325 |
| 5,434,026 | 7/1995 | Takatsu et al. | 430/30 |
| 5,468,595 | 11/1995 | Livesay | 430/296 |
| 5,631,120 | * 5/1997 | Swirbel et al. | 430/330 |
| 5,698,377 | 12/1997 | Seino | 430/325 |
| 5,876,904 | * 3/1999 | Uetani | 430/326 |

FOREIGN PATENT DOCUMENTS 0 227 851  12/1985  (EP) .
0 601 887 B1  6/1994  (EP) .

OTHER PUBLICATIONS

T. Murakami, "Multilayer Circuit Fabrication Using Double Exposure of Positive Resist", IBM Technical Disclosure Bulletin, vol. 36, No. 10, Oct. 1993, pp. 423–424.

Kunze, et al., "Bleachable Dyed–Resist—Investigation of Its Process Latitude In Comparison With Standard Resists", Microelectronic Engineering 25, 1994, pp. 3–18.

* cited by examiner

Primary Examiner—Mark F. Huff
Assistant Examiner—Saleha R. Mohamedulla
(74) Attorney, Agent, or Firm—McGinn & Gibb, PLLC; Steven Capella, Esq.

(57) ABSTRACT

Improved resolution of lithographic patterns can be obtained using a double exposure process where a resist layer is subjected to a patternwise first exposure followed by a blanket second exposure. The resist composition preferably contains a chemically amplified resist which undergoes significant shrinkage on exposure to radiation, a chemically amplified resist which contains a photo-bleachable component, or a chemically amplified resist which contains a chemical-bleachable component.

20 Claims, 2 Drawing Sheets

PHOTORESIST SYSTEM AND PROCESS FOR AERIAL IMAGE ENHANCEMENT

BACKGROUND OF THE INVENTION

1. Field of the Invention

The present invention generally relates to methods and resist compositions for increasing the resolution of photolithographic patterns and more specifically to an improved double-exposure technique for increasing photolithographic resolution.

2. Description of the Related Art

In optical lithography, the aerial image becomes degraded due to diffraction, especially with sub-half micron patterning. This limits the ultimate resolution of the lithography system. If the resolution of the aerial image is improved or sharpened, the process window can be widened and much smaller features can be formed.

The size reduction of features formed on wafers is limited by the resolution of the aerial image projected on the wafers. To improve resolution, conventional efforts were devoted to manipulating the illumination systems (e.g., off-axis and annular illumination) or to manipulating the masks (e.g., phase shift mask). However, manipulation of the illumination systems has disadvantages, such as loss of intensity and pattern distortion and/or artifacts. Similarly, phase-shift approaches impose stringent conditions on the circuit design, require the printing of high resolution sub-features and demanded special feature size and shape management, making the phase shift mask approach difficult and expensive.

SUMMARY OF THE INVENTION

It is, therefore, an object of the present invention to provide a structure and method for increasing resolution using a double-exposure technique. More specifically, the invention changes the optical and/or physical properties of the exposed area, which then acts as in-situ mask for a subsequent low dose blanket exposure (e.g., double-exposure). Changing the optical and/or physical properties in this manner improves the aerial image of the final pattern.

The first exposure of the specially formulated resist creates optical and physical changes in the inventive resist. For example, as explained in greater detail below, the optical property change includes, but is not limited to, a change in optical density upon the first exposure of the inventive photoresist of the exposed areas of the photoresist with a chemical- or photo-bleachable resist system. The physical property change includes, but is not limited to, manipulating the resist film thickness of upon the first exposure of the inventive photo resist. One way to introduce a change in the physical property is by inducing a reduction of the film thickness upon exposure, using a shrinkable resist system.

The second blanket exposure of the inventive double-exposure enhances the overall aerial image and improves the resolution capabilities of the resist system; i.e., with better defined aerial images, the resolution limits can be pushed further, extending the imaging capability of the optical system when compared with capabilities of conventional optical systems.

More specifically, the invention comprises a system and method of forming a pattern comprising supplying a resist, forming a mask having the pattern over the resist, a first step of exposing the pattern on the resist, removing the mask, heating the resist, and a second step of exposing the resist. The invention also includes steps of reducing a thickness of, chemically bleaching or photo-bleaching exposed regions of the resist prior to the second exposure step.

The supplying step comprises steps of supplying a shrinkable resist, a chemically bleachable resist or a photo-bleachable resist. The step of supplying a shrinkable resist preferably comprises a step of supplying a resist having at least one of partially protected phenolic resins with, tertiary butyl carbonate (t-BOC), ethers, acetals or ketals functional group, or acrylate, methacrylate and cyclic olefin polymers with alkyl or aryl carboxylic esters. The step of supplying a chemically bleachable resist preferably comprises a step of supplying a resist having aryl vinyl ether (R—O—C=C—Ar). The step of supplying a photo-bleachable resist preferably comprises a step of supplying a resist containing a diazonaphthoquinone.

During the second exposing step, unexposed regions of the resist act as a second mask for the exposed regions of the resist. The first exposing step is preferably insufficient to make exposed regions of the resist selectively removable from unexposed regions of the resist and a combination of the first exposing step and the second exposing step is sufficient to make the doubly exposed regions selectively removable from the regions receiving only the second exposure.

In both the shrinkable and bleachable resist systems, the first exposing step may have a higher dosage than the second exposing step. In the photo-bleachable resist system, the first exposing step uses a radiation having a first wavelength and the second exposing step preferably uses a radiation having a second wavelength different than the first wavelength.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
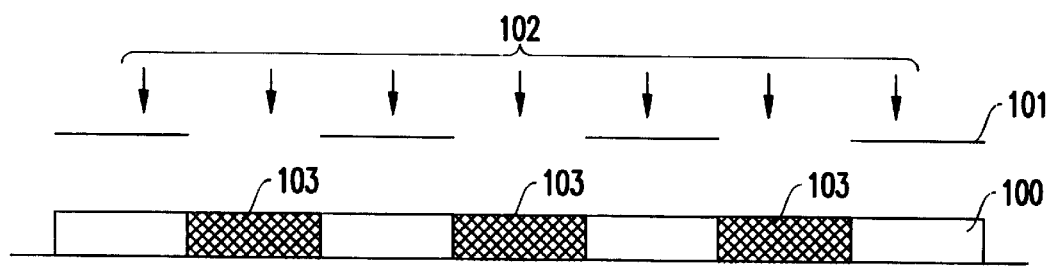
FIGS. 1A–1C are schematic diagrams illustrating cross-sectional views of a photoresist according to the invention.

The well-known Rayleigh model for lithographic resolution is given by the equation:

$$R = k\lambda/NA$$

where R is the resolution, k is an empirically derived parameter that is dependent on photoresist manufacturing practice performance, $\lambda$ is the exposed wavelength, and NA is the numerical aperture of the exposure tool. With NA values reaching their limit at 0.65–0.70, the reduction of the "k" factor is becoming more important in order to achieve higher resolution. Both embodiments of the invention discussed below achieve a high resolution with k value of 0.37 using conventional exposure systems.

The invention includes a system of improving the resolution of resist images through a combination of resist formulation and process modification. The inventive resist formulation undergoes either physical and/or optical changes upon exposure, using existing optical systems. With the invention, the physical and/or optical changes in the resist (induced by the first exposure) lead to an image contrast enhancement upon a second flood exposure.

As discussed above, to improve resolution, conventional efforts were devoted to manipulating the illumination systems (e.g., off-axis and annular illumination) or to manipulating the masks (e.g., phase shift masks). However, with the invention, a first exposure of a modified resist is preferably carried out with a conventional mask, the mask is removed, the exposed resist is preferably baked and a second flood exposure step is performed. Latent images are formed in the resist by the light passing through the mask in the first exposure step. The latent images are governed by the aerial images of the optical system as provided through the patterned mask or other patternwise exposure device.

The first exposure and baking steps cause physical and/or optical property changes to occur in the exposed areas of the resist which, as explained in more detail below, the property changes allow the unexposed regions of the resist to be used as a mask in the second exposure step. In some instances, such as where the photoresist composition contains a photo-bleachable component, optical changes may occur without a baking step after the first exposure, as discussed below.

The second exposure enhances the effective modulation amplitude and thus improves image resolution. After the second exposure step, there is sufficient differential in absorbed energies between the doubly exposed and singly unexposed areas to make the pattern defined by the doubly exposed and singly exposed areas developable.

In conjunction with the double-exposure technique discussed above, the invention preferably uses a resist composition adapted to enhance the formation of the above-referenced latent image. One approach involves formulating the resist to have a high shrinkage rate after the first exposure to radiation and baking. Another approach involves formulating the resist with photo-bleachable and/or chemical- bleachable components or additives that bleach during the first exposure and/or during heating after the first exposure. For example, the inventive resist formulation may contain a chemical-bleachable dye or photo-bleachable dye which modifies the optical density of the exposed region. The exposed region, in such case, would experience a decrease in optical density compared to the unexposed region. The difference in optical density modulates the light intensity passing through the resist during the second (flood) exposure (e.g., a previously unexposed region of high optical density passes less light than a previously exposed region of low optical density) thus, enhancing the resolution of the image created by the first exposure.

FIRST EMBODIMENT

The first embodiment of the invention comprises a shrinkable resist system wherein, the resist is baked after the first exposure to complete a chemical amplification and deprotection reaction within the exposed regions of the resist, which decreases the thickness of the exposed regions. By reducing the thickness of the exposed regions, the photosensitizer concentration (only partially consumed in the first exposure and bake) is effectively increased in the exposed areas compared to the unexposed regions.

The increase in photosensitizer concentration causes the resist to become more sensitive in the exposed regions during the second exposure step. The resulting difference in sensitivity between exposed and unexposed regions of the resist layer allows the resist to be used as a mask itself in the second exposure step. In other words, because the previously exposed regions are more sensitive than the previously unexposed regions, the conditions (dose) of the second exposure can be selected such that substantial reaction will take place in the previously exposed regions on second exposure, whereas the previously unexposed regions will remain comparatively unaffected by the second exposure; thus, no mask is necessary during the second exposure. Additionally, the created physical structure modulates the light intensity passing through the resist through optical interference effects.

More specifically, FIG. 1A shows a resist layer 100 on a substrate, a mask 101 and an electromagnetic radiation source (not illustrated) which produces electromagnetic radiation (e.g., light) 102. In the first exposure step, the radiation 102 passes through the mask 101 and creates exposed areas 103 within the resist 100. The mask 101 is then removed and the resist is subjected a baking process.

The mask 101 may be formed by any conventional technique. The substrate underlying resist layer 100 may be any conventional substrate commonly used in the manufacture of semiconductor devices. Thus, uppermost portion of the substrate may comprise a material such as a semiconductor, metal or dielectric to eventually receive a pattern corresponding in some manner to the pattern of mask 101. In some instances, intermediate coatings such as anti-reflective coatings may be applied to the substrate prior to application of resist layer 100. Such substrates and intermediate coatings are well known by one ordinarily skilled in the art given this disclosure and a detailed discussion of the same is omitted for the sake of brevity and to make the novel features of the invention more clear.

Figure 1B:
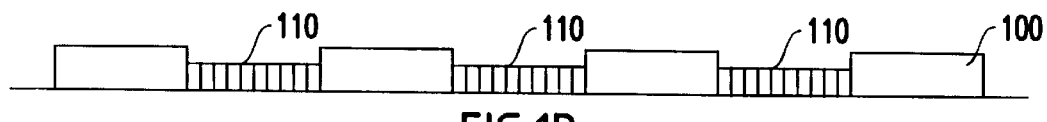

FIG. 1B illustrates the structure after the baking process. The exposed areas 103 shrink in thickness to form exposed regions 110, as a result of the first exposure and baking processes. The shrinkage of the resist is caused by the escape of volatile components generated by the first exposure and subsequent baking process. The exposed regions 110 have a higher concentration of photosensitive compound as a result of the change in volume.

Figure 1C:
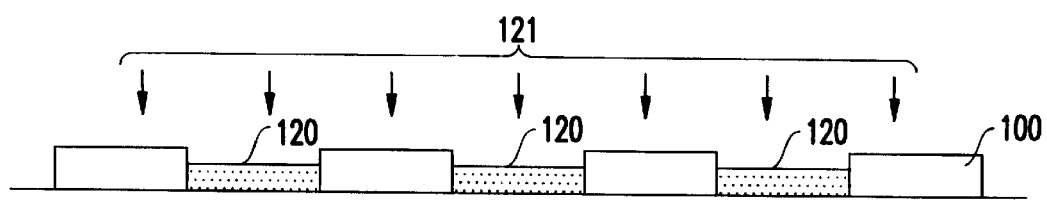

As illustrated in FIG. 1C, the entire resist is subjected to a second exposure 121, which forms double exposed regions 120. The second exposure preferably has a lower dosage than the first exposure. The resist may also be subjected to an additional baking process after the second exposure to further complete the desired reaction. The desired pattern in the resist layer (corresponding to the latent image) may then be obtained by developing using known techniques appropriate for the selected resist composition. Typically, development of the pattern will involve dissolution of the double-exposed areas of the resist using an aqueous alkaline developer solution.

As is known by those ordinarily skilled in the art, resist materials change chemical composition when they are patternwise exposed to certain radiation which makes portions of a resist layer selectively removable after patternwise exposure of the resist. Depending upon whether a positive or negative resist is utilized, only the exposed portion or unexposed portion of the resist will be removed by a given removal (development) process.

The resist composition preferably undergoes a substantial amount of shrinkage upon radiation exposure and baking. Preferred resist compositions contain a positive tone resist polymer such as phenolic resins (e.g., such as novolak and polyhydroxystyrenes), acrylates, methacrylates and cyclic olefin polymers. The positive tone resist polymers preferably contain acid-labile protecting groups such as tertiary butyl carbonate (t-BOC), alkyl/aryl carboxylic esters, ethers, acetals, and ketals, etc. The acid-labile groups used preferably create reaction products upon acid-catalyzed cleaving which reaction products are driven from the exposed resist during the post-exposure baking step. The resist polymer may contain a combination of two or more different acid-labile groups on the same polymer chain or polymer blends can also be used to achieve better performance using this invention. The amount of acid-labile protecting groups in the resist polymer is preferably selected such that (a) the unexposed resist composition is substantially insoluble in aqueous alkaline solutions (such as are typically used as developer) and (b) the resist composition becomes soluble in aqueous alkaline solutions after exposure to a suitable radiation and post-exposure bake.

Preferred positive tone resist polymer contains hydroxystyrene monomer units having acid-labile protecting groups thereon. In addition to such monomers, the preferred resist polymer may contain other monomer units having acid-labile groups (e.g., tertiary butyl acrylate) as well as monomers such as styrene and hydroxystyrene.

In addition to the resist polymer, the resist composition would typically contain one or more photosensitive acid generators. The invention is not limited to any specific choice of photosensitive acid generator.

To further increase the shrinkage response of the resist, additives (e.g., monomers, oligomers) having volatile acid-labile moieties may be utilized to further enhance the shrinkage. Some compounds used as dissolution inhibitors may be used for this purpose.

The resist compositions may further include other known expedients such as acid scavengers, photosensitizers, etc. The shrinkage can also be achieved by attaching some protecting groups to these components.

SECOND EMBODIMENT

A second embodiment of the invention comprises a bleachable resist system. The bleaching process reduces the optical density of the exposed regions (i.e., allows more radiation/light to pass).

Figure 2A:
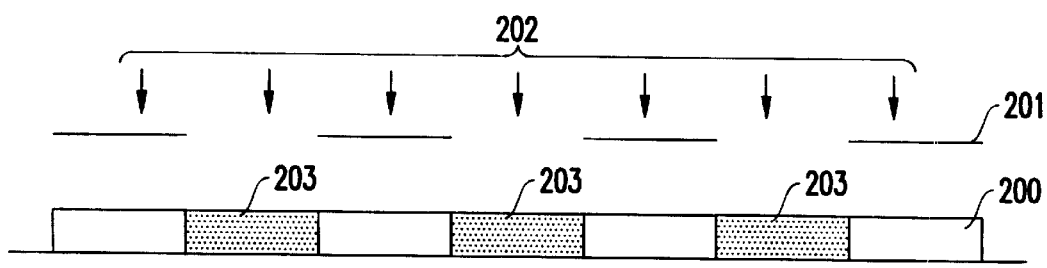
FIGS. 2A–2C are schematic diagrams illustrating cross-sectional views of a photoresist according to the invention.
Figure 2B:
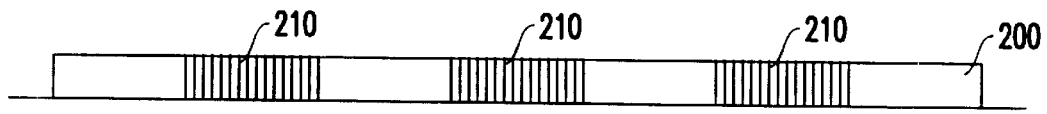
Figure 2C:
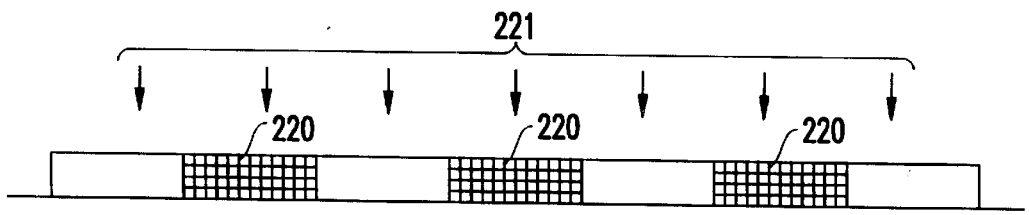

The second embodiment of the invention is illustrated in FIGS. 2A–2C. The embodiment illustrated in FIGS. 2A–2C is similar to the embodiment illustrated in FIGS. 1A–1C. However, in the embodiment illustrated in FIGS. 2A–2C, the optical density of the regions exposed in the first exposure step is decreased as a result of bleaching occurring in the exposed regions.

More specifically, FIG. 2A illustrates a resist layer 200 on a substrate, a mask 201 and an electromagnetic radiation source (not illustrated) which produces electromagnetic radiation 202 (e.g., light). The light 202 passes through mask 201 and creates exposed areas 203 within the resist 200. The mask 201 is then removed.

In a chemical-bleachable application of the second embodiment, the resist is baked after the first exposure to execute a chemically amplified (i.e., acid-catalyzed) bleaching process within the exposed regions. Alternatively, in a photo-bleachable application of the second embodiment of the invention, the optical density of the exposed regions decreases simply as a result of the first exposure.

The bleaching process with the photo-bleachable resist occurs mainly during the first exposure (and perhaps to some extent in the second exposure) while bleaching of the chemical-bleachable resist occurs mainly during the baking process after the first exposure step. Indeed, with the photo-bleachable resist, the baking step between exposures can preferably be omitted, as discussed in more detail below.

FIG. 2B illustrates the structure after the baking process. The exposed areas 203 are transformed to less optically dense exposed regions 210. The regions 210 have a reduced optical density because of the effect of the bleaching process.

As illustrated in FIG. 2C, the entire resist is subjected to a second exposure 221, which forms double exposed regions 220. The second exposure preferably has a lower dosage than the first exposure. The resist may be subjected to an additional baking process after the second exposure to further complete the desired reaction.

After the resist undergoes the second exposure step, the doubly exposed areas of the resist are removed, typically by dissolution in an aqueous alkaline solution, to delineate the desired patterns.

Preferred photo-bleachable resist compositions contain a photo-bleachable component in combination with a resist polymer containing acid-labile groups. The photo-bleachable component preferably is a photo-bleaching dye which bleaches upon exposure to G and/or I-line (436 and 365 nm) radiation such as diazonaphthoquinone (DQ). Preferably, the photo-bleachable resist formulation is formed by simply combining the photo-bleachable component (e.g., DQ) with a conventional (preferably DUV-sensitive) chemically amplified resist composition. The amount of the photo-bleachable component in the composition is preferably sufficient to raise the absorption of the resist composition to about 0.1–0.5. Preferably, the resist composition contains about 5–30 wt. % of the photo-bleachable component based on the weight of the resist polymer in the chemically amplified resist composition. Preferably, the photo-bleachable component and the chemically amplified resist are selected such that the photo-bleachable component can be bleached upon exposure to a radiation wavelength where the chemically amplified resist does not show significant sensitivity.

In the photo-bleaching application, the first exposure is a patternwise exposure through the desired mask at a first wavelength (e.g., 436 nm or 365 nm for diazonaphthoquinone). The first exposure modifies the bleachable component in the exposed regions to reduce the optical density of the exposed composition at the wavelength of the second exposure, allowing the photosensitive component (e.g., photosensitive acid generator) of the resist to absorb more energy of a second wavelength (e.g., 248 nm in this example). Prior to the first exposure, the dyed resist would otherwise remain very insensitive to light having the second wavelength (i.e., the unbleached dye, rather than the photosensitive acid generator, would absorb most of the energy).

Therefore, after the first exposure step, the mask can be removed and, without an intervening baking step, the blanket second exposure to radiation having the second wavelength will cause a substantial photo-reaction in the regions previously exposed to the first wavelength of light. However, the second exposure will leave the previously unexposed regions of the resist very little affected. Since the radiation of the second wavelength does not appreciably affect the previously unexposed regions, the dosage (energy) of the second exposure can be the same, greater than or less than that of the first exposure.

In the chemical bleaching application, a chemically-bleachable dye is included with the resist, the chemical changes which occur within the resist during the first exposure permit the chemically-bleachable dye to decrease the optical density of the exposed regions during the post-exposure baking process. Then, after the baking process, the blanket second radiation exposure (which may or may not have the same wavelength and dosage as the first exposure) penetrates through and into the previously exposed, less optically dense regions to further distinguish the developability of the doubly-exposed regions and singly exposed regions.

For the chemical bleaching application, the resists can preferably be obtained by adding a chemically bleachable dye to a chemically amplified resist (either positive or negative). An example of one class of suitable dyes are aryl vinyl ethers (R—O—C=C—Ar, where Ar represents an aryl group). The ethylene group attached to aromatic group makes the compound strongly absorb 248 nm light. During an acid catalyzed reaction in the post-exposure baking step after the first exposure, the double bond of the dye is converted to a single bond which reduces (or eliminates) the dye's absorption at 248 nm. The oxygen of these vinyl ether compounds can be replaced with nitrogen or sulfur to give a set of alternative compounds which will also have bleaching properties. It should be understood that chemically-bleachable components having suitable response may also be used.

The amount of chemically bleachable component is preferably sufficient to raise the absorption of the overall resist composition to about 0.3–0.5 at the radiation wavelength where the chemically amplified resist exhibits sensitivity.

The second embodiment of the invention modifies the composition of the resist and the process utilized to expose the resist in order to increase the demarcation between exposed and unexposed regions and thereby increase the resolution of (and correspondingly reduce the minimum feature size attainable with) the photolithographic process.

As would be known by one ordinarily skilled in the art given this disclosure, the aerial image enhancement techniques discussed above with the first and second embodiments can also use a combination of radiation sources (e.g., a first exposure with 248 nm and a second exposure with 365 nm or 193 nm radiation) depending upon the specific application involved. Similarly, the radiation source can be ion beam, x-ray, ebeam or optical sources with different wavelengths such as 193 nm, 248 nm, 313 nm, 365 nm or 436 nm.

Moreover, the first and second embodiments can be combined. Therefore, the exposed areas 210 can have both a reduction of thickness, as described above in FIG. 1B, as well as a reduction of optical density, as described above in FIG. 2B. Similarly, while a double-exposure technique is discussed in the examples above, the invention is not limited thereto and is equally applicable to multiple exposure techniques depending upon the specific application involved, as would be known by one ordinarily skilled in the art given this disclosure.

As smaller and smaller features are defined, the dose of light reaching an exposed area of a resist becomes less and less. The selectivity with which exposed and unexposed areas of the resist can be removed decreases as the dose applied to the resist decreases (with the smaller feature size) because smaller doses of light will cause a reduced chemical reaction to occur within the resist. The minimum lithographic feature which can be achieved is dependent upon the minimum dose which will cause sufficient chemical change in the resist to allow the resist to be selectively removed.

The invention allows smaller and smaller features to be defined by using specialized resists with a double-exposure technique to increase the chemical reaction within the exposed areas of the resist. By increasing the chemical reaction within the exposed regions, smaller doses of light can be applied to the resist while still allowing the necessary chemical reaction to occur to makes the resist selectively removable. Therefore, the invention allows formation of lithographic features which are smaller than can be attained with conventional efforts.

While illustrative examples of the invention are included herein, as would be known by one ordinarily skilled in the art given this disclosure, the invention is not limited to the embodiments or examples contained herein. Instead, the invention is applicable to all systems or methods of forming structures or patterns as well as other similar processes and systems.

EXAMPLE 1

In a first example, the following ingredients are dissolved in propylene glycol monomethyl ether acetate (PGMEA) solvent for a total of 16 weight % solids: a polymer resin comprising a terpolymer containing the following units: 35 mole % t-butylacrylate, 40 mole % methoxycyclohexene-protected hydroxystyrene and 25 mole % hydroxystyrene; a photosensitive acid generator comprising di(t-butylphenyl) iodonium camphor sulfonate 4 wt. % of the polymer; an acid scavenger comprising tetrabutyl ammonium hydroxide 0.3 wt. % of the polymer; and a surfactant comprising 200–400 ppm FLUORAD FC430 surfactant (sold by 3M, Industrial Chemical Products Division) to total resist volume.

The resulting solution is filtered through 0.2 micron filter. The resist is then spin coated on two 5 inch silicon wafers (precoated with 1200 angstrom thick polysulfone bottom ARC) which are then soft-baked at 100° C. for 90 seconds. The first wafer was first exposed to DUV light (248 nm wavelength) using a Canon stepper (0.37 NA) through a mask at a dose of 51 mJ/cm$^2$. The second wafer was exposed in a similar manner at a dose of 57 mJ/cm$^2$. These wafers are post-exposure baked at 80° C. for 90 seconds. The first wafer is then subjected to a second exposure at 6 mJ/cm$^2$ without a mask. Both wafers are baked again at 115° C. for 90 seconds and then developed with 0.263 TMAH developer for 60 seconds.

With the above process, the first wafer subject to the double-exposure according to the invention resolves 250 nm line and space features. On the other hand, the second wafer which was subjected only to the single exposure does not resolve 250 nm images at the same total radiation dose.

EXAMPLE 2

In a second example, a copolymer of t-butyl acrylate and hydroxystyrene (35/65 mole %) is preferably dissolved in PGMEA with 4 wt. % (based on polymer) of di(t-butyl phenyl) iodonium camphor sulphonate 0.3 wt. % (based on polymer) of tetrabutyl ammonium hydroxide and 200–400 ppm FLUORAD FC430 surfactant (sold by 3M, Industrial Chemical Products Division) to make a solution with 16 wt. % solid content, then 20 wt. % beta-methoxystyrene (based on total solid weight) is added to the solution.

The resulting solution is filtered through a 0.2 micron filter. The resist is then spin coated on two 5 inch silicon wafers (precoated with 1200 angstrom thick polysulfone bottom ARC) which are soft-baked at 80° C. for 90 seconds. The first wafer was exposed to DUW light (248 nm wavelength) at 63 mJ/cm$^2$ using a Canon stepper (0.37 NA) with a mask. The second wafer was exposed in a similar manner at a dose of 69 mJ/cm$^2$. These wafers are post-exposure baked at 80° C. for 90 seconds. The first wafer is then subjected to a second exposure at 6 mJ/cm$^2$ without a mask. Both wafers are baked again at 115° C. for 90 seconds and then developed with 0.263N TMAH developer for 60 seconds. The first wafer subject to the double-exposure in accordance with the invention resolves a 250 nm line and space features. On the other hand, the second wafer subjected only to a single exposure does not resolve 250 nm images at the same total energy dose.

EXAMPLE 3

Figure 3:
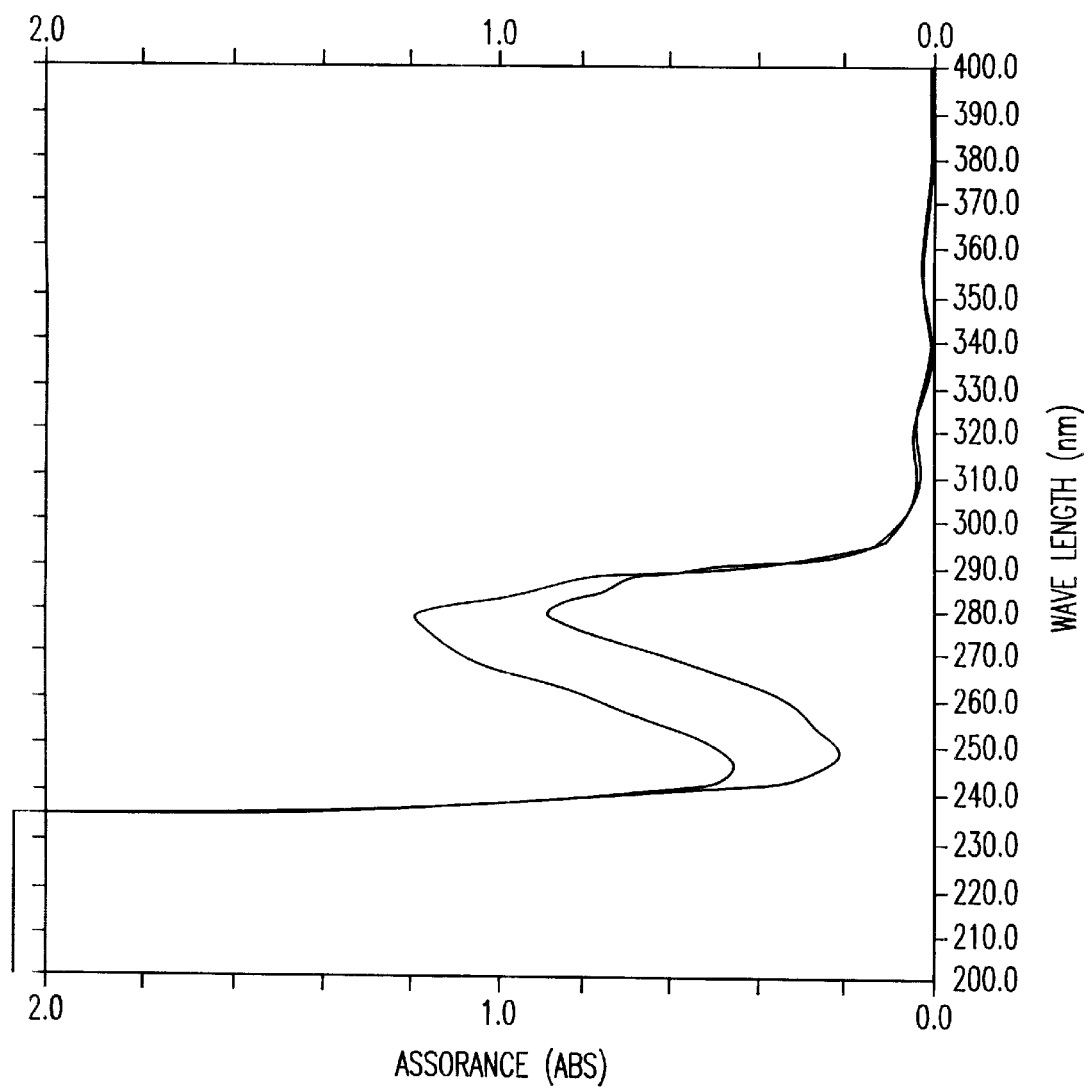
FIG. 3 is a graph illustrating the absorption change during chemical bleaching according to the invention.

FIG. 3 shows the absorption spectra of a resist film of (approximately 9400 angstrom) spin coated on a quartz plate as in example 2 measured before and after chemical bleaching. The exposure dose is 90 mJ/cm$^2$ at 248 nm. The absorbency change after post-exposure bake is from 0.45 to 0.22 at 248 nm. The bleached absorbency indicates that the residual dye absorption is very low. The major absorption after chemical bleaching is from the polymer resin, especially the phenol units. Therefore, as shown by this example, it is preferable to have low absorbing resins like polymers with pure acrylate or cyclic olefin such as norbomene and adamantyl units in the inventive resist.

EXAMPLE 4

In a fourth example, 25% beta-methoxystyrene (based on the solid weight in the resist) is preferably added to a commercial resist APEX-E (sold by Shipley Company) which is based on t-BOC partially protected polyhydroxystyrene. The resulting solution is filtered through a 0.2 micron filter. The resist is then spin coated on two 5 inch silicon wafers (precoated with 1200 angstrom thick polysulfone bottom ARC) which are soft-baked at 80° C. for 90 seconds. The first wafer was then exposed to DUV light (248 nm wavelength) at 16 mJ/cm$^2$ doses using Canon stepper (0.37 NA) with mask. The second wafer was exposed in a similar manner at a dose of 22 mJ/cm$^2$. The wafers are postexposure baked at 90° C. for 90 seconds. The first wafer is then subjected to a second exposure at 6 mJ/cm$^2$ without a mask. Both wafers are baked again at 90° C. for 90 seconds and then developed with 0.263N TMAH developer for 60 seconds. The first wafer subject to the double-exposure according to the invention resolves a 270 nm line and space features. On the other hand, the second wafer which is subjected only to a single exposure does not resolve 250 nm images at the same total energy dose.

While the invention has been described in terms of preferred embodiments, those skilled in the art will recognize that the invention can be practiced with modification within the spirit and scope of the appended claims.

We claim:

1. A method of forming a pattern comprising, in the following order:

supplying a resist;

forming a first mask having said pattern over said resist;

a first exposing of said pattern on said resist through said first mask, said first exposing creating first exposed regions and first unexposed regions;

removing said first mask;

heating said resist; and a second exposing of said resist, wherein, during said second exposing, said first unexposed regions act as a second mask for said pattern to increase resolution of said pattern within said resist when compared to a resolution of said pattern formed by said first exposing.

2. The method as in claim 1, wherein said heating reduces a thickness of exposed regions of said resist.

3. The method as in claim 1, wherein said heating comprises chemically bleaching exposed regions of said resist.

4. The method as in claim 1, wherein said first exposing comprises photo-bleaching exposed regions of said resist.

5. The method as in claim 1, wherein said supplying comprises supplying a shrinkable resist.

6. The method as in claim 1, wherein said supplying comprises supplying a chemically bleachable resist.

7. The method as in claim 1, wherein said supplying comprises supplying a photo-bleachable resist.

8. The method as in claim 5, wherein said supplying of said shrinkable resist comprises supplying a resist containing at least one component selected from the group consisting of (a) phenolic resins partially protected with protecting groups including tertiary butyl carbonate (t-BOC), ethers, acetals or ketals, and (b) alkyl or aryl carboxlic esters of acrylate, methacrylate or cyclic olefin polymers.

9. The method as in claim 6, wherein said supplying of said chemically bleachable resist comprises supplying a resist containing aryl vinyl ether (R—O—C=C—Ar).

10. The method as in claim 7, wherein said supplying of said photo-bleachable resist comprises supplying a resist having diazonaphthoquinone.

11. The method as in claim 1, wherein said first exposing provides a radiation dose insufficient to make exposed regions of said resist selectively removable from unexposed regions of said resists and a combination of said first exposing and said second exposing provides a radiation dose sufficient to make said exposed regions selectively removable from said unexposed regions.

12. The method as in claim 5, wherein said first exposing has a higher radiation dosage than said second exposing.

13. The method as in claim 7, wherein said first exposing has a first wavelength and said second exposing has a second wavelength different than said first wavelength and said second wavelength causes less bleaching of said resist than said first wavelength.

14. The method as in claim 10, wherein said first exposing has a wavelength between 436 nm and 365 nm and said second exposing step has a 248 nm wavelength.

15. A method of forming a pattern comprising, in the following order:

supplying a resist containing a photo-bleachable component;

providing a mask having said pattern over said resist;

a first exposing of said pattern on said resist by passing radiation through said mask, said first exposing creating first exposed regions and first unexposed regions, said radiation causing bleaching of said photo-bleachable component;

removing said mask; and a blanket exposing of said resist to radiation such that said first unexposed regions act as a second mask for said pattern to increase resolution of said pattern within said resist when compared to a resolution of said pattern formed by said first exposing.

16. The method of claim 15, wherein said photo-bleachable component bleaches upon exposure to radiation having a wavelength of 365–436 nm.

17. The method of claim 1, wherein said resist supplied contains a chemically amplified resist sensitive to 248 mn radiation.

18. The method of claim 16, wherein said first exposing is conducted with radiation having 365–436 nm wavelength.

19. The method as in claim 7, wherein said resist is bleached during said first exposing and said second exposing and said first exposing has a first wavelength and said second exposing has a second wavelength and said second wavelength causes less bleaching of said resist than said first wavelength.

20. The method as in claim 15, wherein said resist is bleached during said first exposing and said second exposing and said first exposing has a first wavelength and said second exposing has a second wavelength and said second wavelength causes less bleaching of said resist than said first wavelength.

* * * * *